United States Patent
Huang et al.

(10) Patent No.: US 8,659,090 B2
(45) Date of Patent: Feb. 25, 2014

(54) RESISTIVE MEMORY AND METHODS FOR FORMING THE SAME

(75) Inventors: Chia-En Huang, Xinfeng Township (TW); Wun-Jie Lin, Hsin-Chu (TW); Ling-Chang Hu, Lugang Township (TW); Hsiao-Lan Yang, Taipei (TW); Chih-Chieh Chiu, Toufen Township (TW); Wei-Shuo Kao, Taichuang (TW); Hong-Chen Cheng, Hsin-Chu (TW); Fu-An Wu, Hsin-Chu (TW); Jung-Ping Yang, Juibei (TW); Cheng Hung Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 13/335,569

(22) Filed: Dec. 22, 2011

(65) Prior Publication Data

US 2013/0161707 A1 Jun. 27, 2013

(51) Int. Cl.
*H01L 29/78* (2006.01)
*H01L 21/336* (2006.01)

(52) U.S. Cl.
USPC ............. 257/368; 257/43; 257/288; 257/299; 257/308; 257/347; 257/E21.409; 257/E21.431; 257/E29.255; 438/287; 438/293; 438/653

(58) Field of Classification Search
USPC .................. 257/43, 288, 299, 308, 347, 368, 257/E21.409, E21.431, E29.255; 438/287, 438/293, 653

See application file for complete search history.

(56) References Cited

U.S. PATENT DOCUMENTS

| | | | |
|---|---|---|---|
| 6,274,900 B1 * | 8/2001 | San et al. ........................ | 257/314 |
| 7,442,638 B2 * | 10/2008 | Frohberg et al. .............. | 438/638 |
| 8,541,303 B2 * | 9/2013 | Lai et al. ........................ | 438/653 |
| 2008/0073694 A1 * | 3/2008 | Willer et al. .................. | 257/316 |
| 2010/0291746 A1 * | 11/2010 | Yoo et al. ...................... | 438/305 |
| 2012/0098070 A1 * | 4/2012 | Wang ............................. | 257/368 |

OTHER PUBLICATIONS

Hu, C., "Interconnect Devices for Field Programmable Gate Array," 1992, IEEE, pp. 591-594.

* cited by examiner

*Primary Examiner* — Dao H Nguyen
(74) *Attorney, Agent, or Firm* — Slater & Matsil, L.L.P.

(57) ABSTRACT

A device includes an active region formed of a semiconductor material, a gate dielectric at a surface of the active region, and a gate electrode over the gate dielectric. A first source/drain region and a second source/drain region are on opposite sides of the gate electrode. A Contact Etch Stop Layer (CESL) is over the first and the second source/drain regions. An Inter-Layer Dielectric (ILD) includes a top surface substantially level with a top surface of the gate electrode. A first contact plug is over and electrically connected to the first source/drain region. A second contact plug is over and aligned to the second source/drain region. The second contact plug and the second source/drain region are spaced apart from each other by a portion of the first CESL to form a capacitor.

20 Claims, 5 Drawing Sheets

RESISTIVE MEMORY AND METHODS FOR FORMING THE SAME

BACKGROUND

In the formation of Non-Volatile Memory (NVM) devices, the manufacturing cost, sizes, and the metal routing to the NVM devices are issues that need to be taken into consideration. When integrated with Complementary Metal-Oxide-Semiconductor (CMOS) devices, the NVM devices typically require extra process steps in addition to the process step for forming the CMOS devices. Recently, some emerging NVM devices, such as Resistive Random Access Memory (ReRAM) devices are developed. The manufacturing of the ReRAM devices also has the similar issues.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 8A are cross-sectional views of intermediate stages in the manufacturing of a resistive memory device in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Resistive Random Access Memory (ReRAM) device and the method of forming the same are provided in accordance with various exemplary embodiments. The intermediate stages in forming the ReRAM device are illustrated. The variations and the operation of the ReRAM device in accordance with embodiments are discussed. Throughout the various views and illustrative embodiments, like reference numbers are used to designate like elements.

Figure 1:
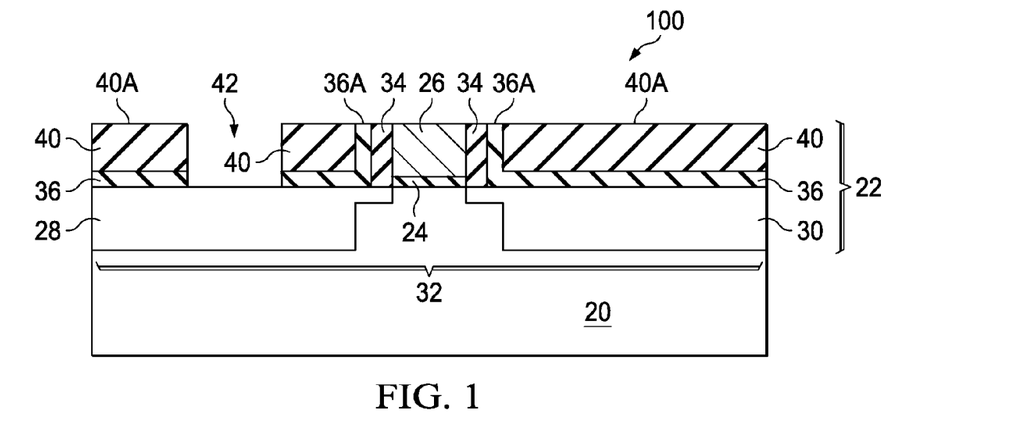

Referring to FIG. 1, wafer 100 is provided. Wafer 100 includes substrate 20, which may be formed of semiconductor materials such as silicon, silicon germanium, or the like, and may be a bulk substrate, or a semiconductor-on-insulator (SOI) substrate. Some components of Metal-Oxide-Semiconductor (MOS) device (transistor) 22, which may be planar MOS devices or Field-Effect Transistors (FinFETs), are formed at a top surface of substrate 20. MOS device 22 includes gate dielectric 24, gate electrode 26 on gate dielectric 24, first source/drain region 28, and second source/drain region 30. Source/drain regions 28 and 30 include a source region and a drain region. Gate dielectric 24 and gate electrode 26 are formed over active region (OD) 32, which may be a portion of semiconductor substrate 20. Gate dielectric 24 may be formed of silicon oxide, silicon nitride, high-k dielectric materials, combination thereof, and multi-layers thereof. Gate electrode 26 may be a metal gate, although it may also be formed of polysilicon, metal silicides, or the like. First source/drain region 28 and second source/drain region 30 may be doped with a p-type impurity such as boron, indium, or the like. Alternatively, first source/drain region 28 and second source/drain region 30 may be doped with an n-type impurity such as phosphorous, arsenic, or the like. The doping concentration of source/drain regions 28 and 30 may be between about $10^{19}/cm^3$ and about $10^{21}/cm^3$, for example, although higher or lower impurity concentrations may be used. Gate spacers 34 are formed on the sidewalls of gate electrode 26, wherein gate spacers 34 may be formed of, for example, a silicon oxide layer and a silicon nitride layer on the silicon oxide layer.

Contact Etch Stop Layer (CESL) 36 may be formed on the sidewalls of gate spacers 34 and extends over first source/drain region 28 and second source/drain region 30. CESL 36 comprises a dielectric material. In some embodiments, CESL 36 comprises silicon oxide, silicon nitride, silicon oxynitride, silicon carbide, combinations thereof, and multi-layers thereof. In accordance with alternative embodiments, CESL 36 may comprise high-k dielectric materials, which may comprise the oxides and/or the silicates of metals such as hafnium, aluminum, lanthanum, and the like. In yet alternative embodiments, CESL 36 may comprise porous dielectric materials such as SiOx, SiN, SiON, TiOx, TaOx, NiOx, CuOx, WOx, HfOx, SiHfxOy (wherein values x and y indicate the atomic ratios of the respective elements), and/or the like. Inter-Layer Dielectric (ILD) 40 is formed over CESL 36. In some embodiments, ILD 40 comprises phospho-silicate glass (PSG), boro-silicate glass (BSG), boron-doped phospho-silicate glass (BPSG), or the like. ILD 40 may also be formed of a low-k dielectric material such as $SiO_2$ (or other silicon oxide represented by SiOx) with air gap structures, and/or the like. In accordance with some embodiments, gate electrode 26 is formed using a gate-last approach (although the gate-first approach is also usable). As a result, the top surface of gate electrode 26 is level with top surface 40A of ILD 40 and top edges 36A of CESL 36.

As also shown in FIG. 1, ILD 40 and CESL 36 are etched to form opening 42, through which source/drain region 28 is exposed. In the meantime, no etching is performed on the portions of ILD 40 and CESL 36 that are directly over source/drain region 30.

Figure 2:
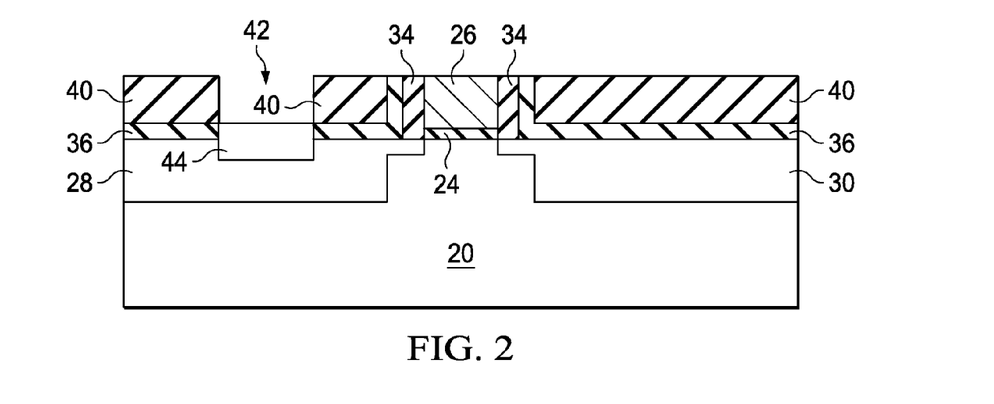
Figure 3:
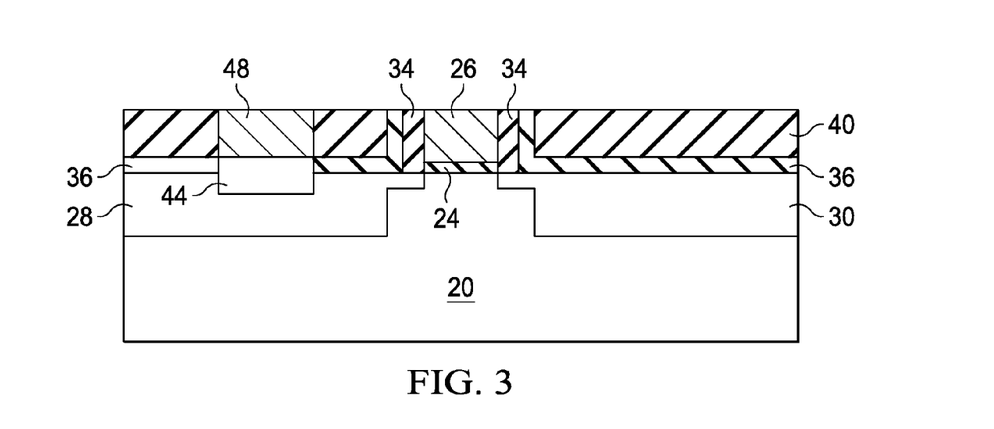

Referring to FIG. 2, after the formation of opening 42, source/drain silicide region 44 is formed on the surface of source/drain region 28 and in opening 42. Since source/drain region 30 is covered, no source/drain silicide region is formed on the surface of source/drain region 30. Next, as shown in FIG. 3, a conductive material is filled into opening 42. A Chemical Mechanical Polish (CMP) is then performed, wherein the CMP is stopped on the top surface of ILD 40. The excess conductive material over the top surface of ILD 40 is removed. As a result, contact plug 48 (also sometimes referred to as M0_OD1 48) is formed. In some embodiments, contact plug 48 is formed of tungsten or tungsten alloys. Alternatively, other metals such as copper, aluminum, or the like, may also be used. The edges of contact plug 48 may be aligned to the respective edges of source/drain silicide region 44 in accordance with some embodiments.

Figure 4:
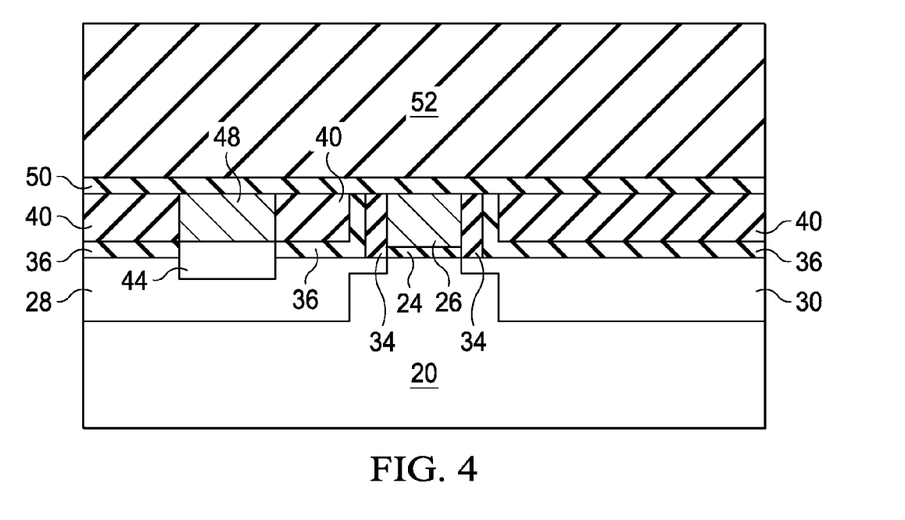
Figure 5:
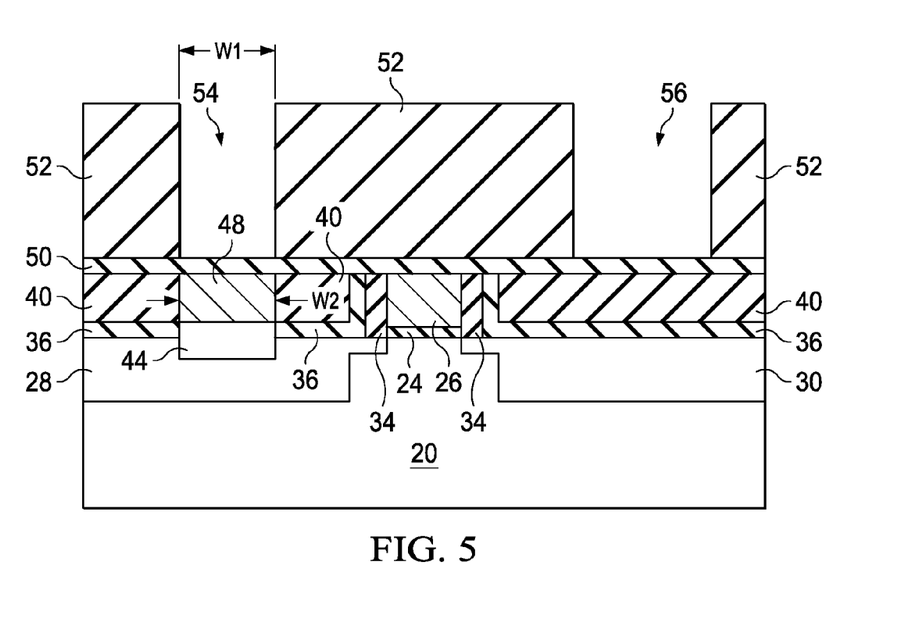

Next, CESL 50 and ILD 52 are formed, as shown in FIG. 4. CESL 50 may comprise silicon oxide, silicon nitride, silicon oxynitride, silicon carbide, combinations thereof, and multi-layers thereof. ILD 52 may comprise PSG, BSG, BPSG, carbon-containing dielectric materials, low-k dielectric materials, or the like. FIG. 5 illustrates the formation of openings 54 and 56 in ILD 52, which is performed through etching. CESL 50 is used as the etching stop layer. Opening 54 is over and vertically aligned to at least a portion of contact plug 48. In some embodiments, horizontal dimension W1 of opening 54 is substantially equal to horizontal dimension W2 of contact plug 48. In alternative embodiments, horizontal dimension W1 of opening 54 is smaller than horizontal dimension W2 of contact plug 48. Opening 56 is over and vertically aligned to a portion of source/drain region 30. The etching may be performed using CESL 50 as an etch stop layer.

Figure 6:
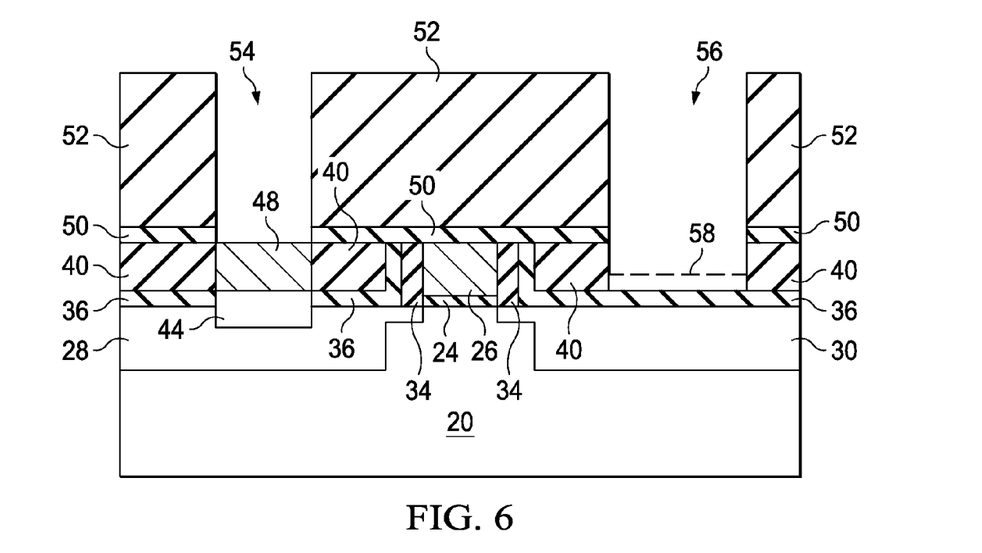

Referring to FIG. 6, a further etching is performed, so that opening 54 extends through CESL 50. As a result, contact plug 48 is exposed through opening 54. Opening 56 also extends down through CESL 50, and ILD 40 may be etched. In some embodiments, the etching uses CESL 36 as an etch stop layer, Accordingly, CESL 36 is exposed through opening 56. Opening 56 may slightly extend into CESL 36 due to the over-etching. In alternative embodiments, the etching stops at an intermediate level between the top surface and the bottom surface of ILD 40, wherein dashed line 58 represents the bottom surface of opening 56 in accordance with these embodiments.

Figure 7:
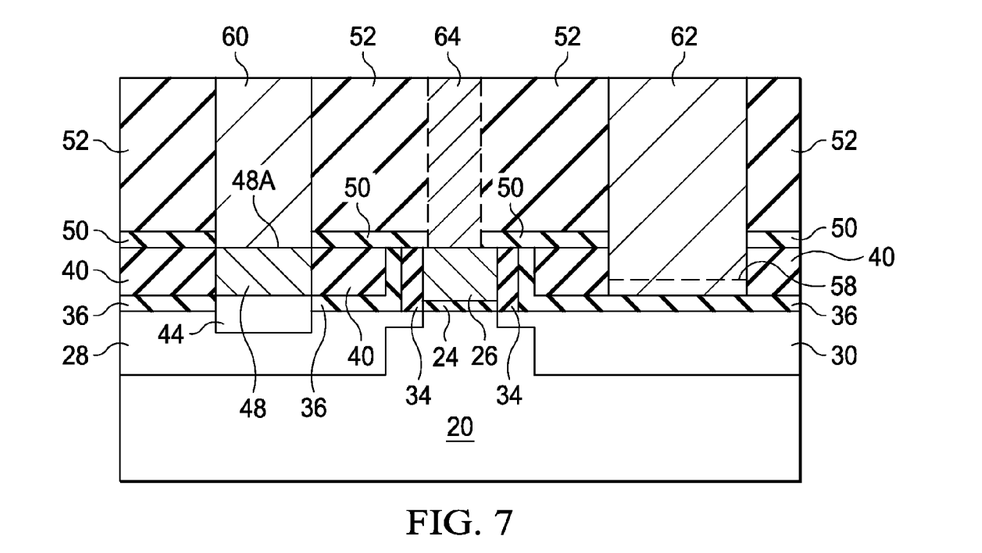

Referring to FIG. 7, contact plugs 60 and 62 are formed in openings 54 and 56, respectively. The formation of contact plugs 60 and 62 may include filling a conductive material into openings 54 and 56, and performing a CMP to remove excess portions of the conductive material that are over the top surface of ILD 52. Contact plugs 60 and 62 may be formed of polysilicon, and hence contact plugs 60 and 62 may alternatively be referred to as M0_poly 60 and 62, respectively. Alternatively, contact plugs 60 and 62 are formed of a metallic material, and hence contact plugs 60 and 62 may sometimes be referred to as M0_OD2 60 and 62, respectively. The metallic material for forming contact plugs 60 and 62 may be selected from the same type of materials for forming M0_OD1 48, and may comprise copper, tungsten, aluminum, and the like. It is appreciated that contact plugs 48 and 60 will form a visible interface 48A since they are formed in different process steps, regardless of whether contact plugs 48 and 60 are formed of a same material or different materials.

FIG. 7 also illustrates the formation of contact plug 64, which is electrically coupled to gate electrode 26. Contact plug 64 thus extends into CESL 50 and ILD 52. A bottom surface of contact plug 64 may be in physical contact with a top surface of gate electrode 26. Contact plug 64 may be formed simultaneously with the formation of contact plugs 60 and 62, for example. In some exemplary embodiments, contact plugs 60, 62, and 64 are formed simultaneously, and are formed of polysilicon. Accordingly, the opening in which contact plug 64 is filled may be formed in the same steps shown in FIGS. 5 and 6. Since contact plug 64 may not be in the same plane as contact plugs 60 and 62, from which plane the cross-sectional view in FIG. 7 is obtained, contact plug 64 is shown using dashed lines.

Figure 8A:
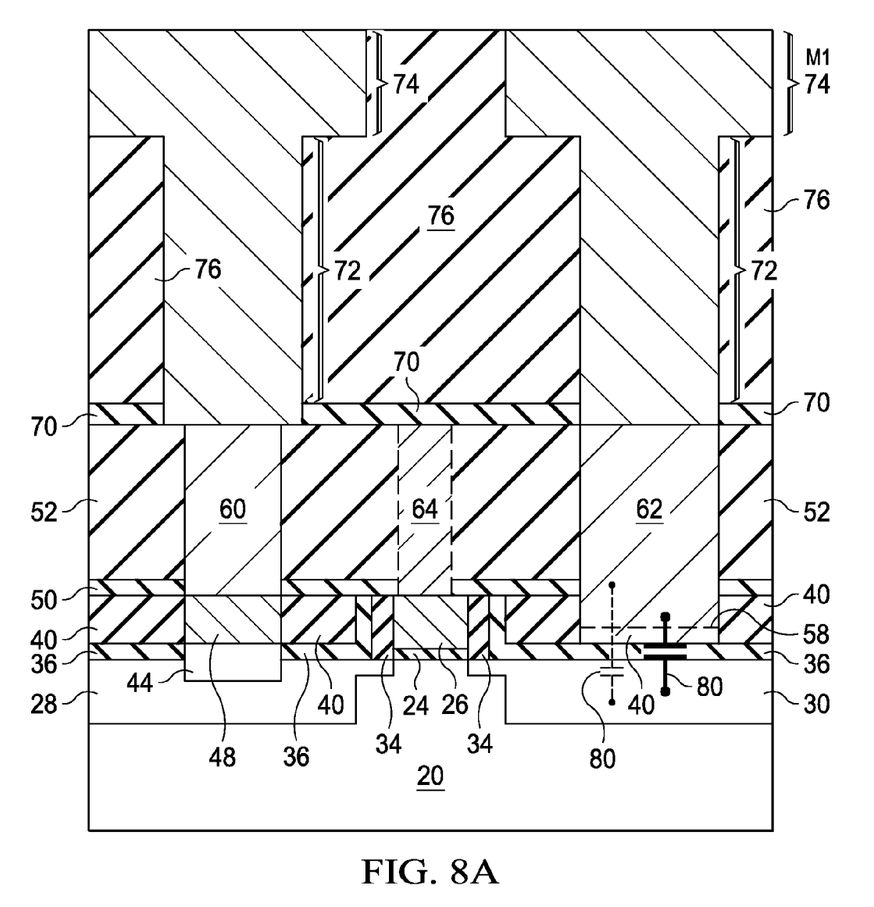

FIG. 8A illustrate additional structures for connecting to contact plugs 60 and 62. The additional structure includes etch stop layer 70, M0 vias 72, and metal lines 74 in bottom metal layer M1. M0 vias 72 and metal lines 74 are formed in dielectric layer 76, which may be formed of a low-k dielectric material having a k value smaller than about 3.0, or smaller than about 2.5, for example. In some embodiments, M0 vias 72 and metal lines 74 may be formed using a dual-damascene process, and hence no noticeable interfaces are formed between M0 vias 72 and the respective overlying metal lines 74. In alternative embodiments, M0 vias 72 are formed using a single-damascene process, and metal lines 74 are also formed using a single-damascene process. In subsequent process steps, more metal layers (not shown) may be formed over metal layer M1.

Figure 8B:
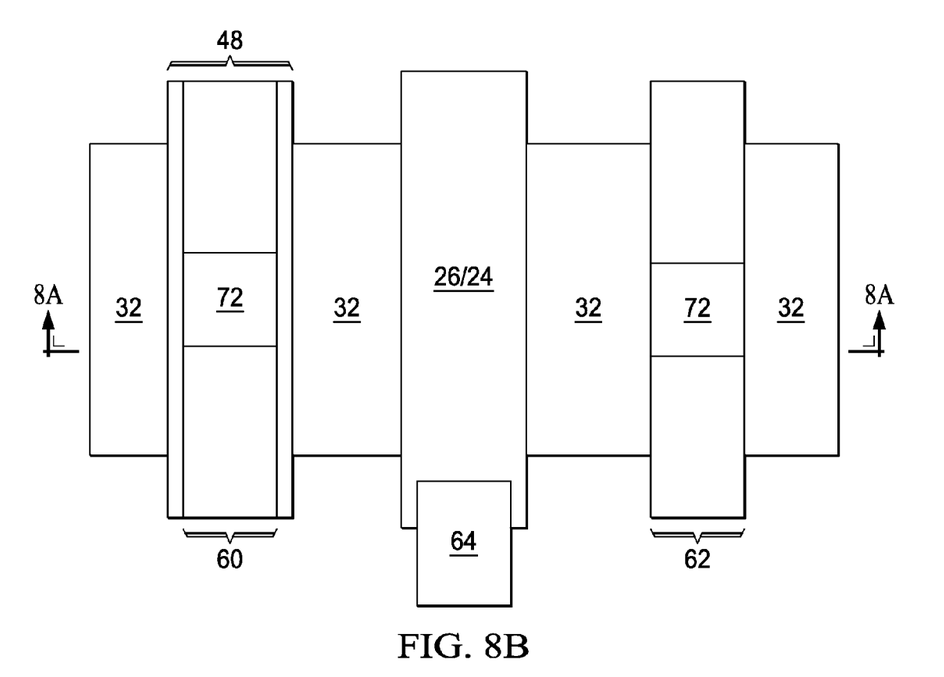
FIG. 8B is a top view of a portion of the resistive memory device shown in FIG. 8A.

FIG. 8B illustrates a top view of various components shown in FIG. 8A, wherein the cross-sectional view shown in FIG. 8B is obtained from the plane crossing line 8A-8A in FIG. 8B. In FIG. 8B, contact plug 64 is shown as being formed outside the boundary of active region 32, and contact plugs 48, 60, and 62 overlap active region 32.

Referring back to FIG. 8A, the illustrated structure includes capacitor 80, which includes contact plug 62 and source/drain region 30 as the capacitor plates, and CESL 36 as the capacitor insulator. In some embodiments, the capacitor insulator may further include a bottom layer of ILD 40, as indicated by dashed line 58 that represent the top surface of the un-etched lower layer of ILD 40. Due to the small size of capacitor 80, the capacitance of capacitor 80 is small, and hence capacitor 80 may be referred to as a tiny capacitor. Capacitor 80 may be used as a memory device, which may be an anti-fuse or a ReRAM device. Accordingly, capacitor 80 is also referred to as memory device 80 hereinafter. Memory device 80 may have a high-resistance state and a low-resistance state. In some exemplary embodiments, the resistance of memory device 80 at the high-resistance state may be greater than about 1 M Ohms. The resistance of memory device 80 at the low-resistance state may be smaller than about 20K Ohms, although the actual resistances may be higher or lower.

Figure 9A:
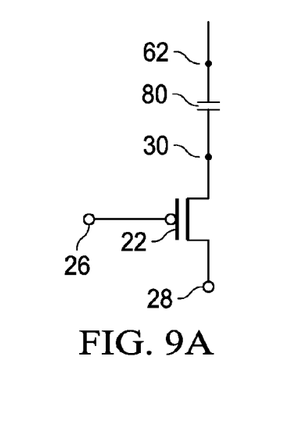
FIGS. 9A and 9B are circuit diagrams of the resistive memory device shown in FIGS. 8A and 8B.
Figure 9B:
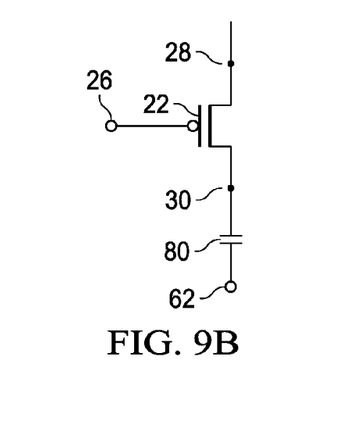

FIGS. 9A and 9B illustrate some exemplary circuit diagrams of the structure shown in FIGS. 8A and 8B, wherein FIG. 9A illustrates that MOS transistor 22 is an NMOS transistor, and FIG. 9B illustrates that MOS transistor 22 is a PMOS transistor. It is appreciated that memory device 80 is connected in series with the source-to-drain path of MOS transistor 22. Accordingly, MOS transistor 22 may be used as a selector for selecting memory device 80 for the program and read operations. For example, referring to FIG. 9A, in a program operation for programming memory device 80 from the high-resistance state to the low-resistance state, MOS transistor 22 is turned on by applying a high voltage to gate electrode 26, and a high voltage is applied to the capacitor plates of memory device 80. In a program operation for programming memory device 80 from the low-resistance state to the high-resistance state, MOS transistor 22 is also turned on, and a high current is conducted through memory device 80.

The memory devices in accordance with the embodiments are compatible with the formation process of Complementary Metal-Oxide-Semiconductor (CMOS) devices, wherein no additional lithography mask and process steps are needed. There is no extra effort for routing the memory devices. Furthermore, MOS transistor 22 and memory device 80 (FIGS. 9A and 9B) may be formed in core device regions and/or Input/output (TO) device regions.

In accordance with embodiments, a device includes an active region formed of a semiconductor material, a gate dielectric at a surface of the active region, and a gate electrode over the gate dielectric. A first source/drain region and a second source/drain region are on opposite sides of the gate electrode. A CESL is over the first and the second source/drain regions. An ILD includes a top surface substantially level with a top surface of the gate electrode. A first contact plug is over and electrically connected to the first source/drain region. A second contact plug is over and aligned to the second source/drain region. The second contact plug and the second source/drain region are spaced apart from each other by a portion of the CESL to form a capacitor.

In accordance with other embodiments, a device includes a semiconductor material, a gate dielectric over the semiconductor material, and a gate electrode over the gate dielectric. A first source/drain region and a second source/drain region are on opposite sides of the gate electrode. A source/drain silicide region is over the first source/drain region. A first CESL is over the first and the second source/drain region. A first ILD is over the first CESL, wherein top edges of the first CESL, a top surface of the gate electrode, and a top surface of the first ILD are substantially level with each other. A second CESL is over the first CESL, the gate electrode, and the first ILD. A second ILD is over the second CESL. A first contact plug is over and connected to the source/drain silicide region. A second contact plug is disposed in the first ILD, wherein the second contact plug is over and aligned to the second source/drain region, and wherein the second contact plug and the second source/drain region are spaced apart from each other by a portion of the first CESL.

In accordance with yet other embodiments, a method includes forming a gate dielectric at a surface of an active region that is formed a semiconductor material, forming a gate electrode over the gate dielectric, and forming a first source/drain region and a second source/drain region on opposite sides of the gate electrode. A CESL is formed over the first and the second source/drain regions. An ILD is formed over the CESL, wherein top edges of the CESL, a top surface of the gate electrode, and a top surface of the ILD are substantially level with each other. The CESL and the ILD are etched to form a first opening, wherein the first source/drain region is exposed through the first opening. A first contact plug is formed in the first opening, wherein the first contact plug is electrically connected to the first source/drain region. The ILD is etched to form a second opening over and aligned to the second source/drain region, wherein the etching of the ILD to form the second opening stops before at least a lower portion of the CESL is etched. A second contact plug is formed in the second opening, wherein the second contact plug and the second source/drain region are spaced apart from each other by the lower portion of the CESL.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
an active region comprising a semiconductor material;
a gate dielectric at a surface of the active region;
a gate electrode over the gate dielectric;
a first source/drain region and a second source/drain region on opposite sides of the gate electrode;
a first Contact Etch Stop Layer (CESL) over the first and the second source/drain regions;
a first Inter-Layer Dielectric (ILD) comprising a top surface substantially level with a top surface of the gate electrode;
a first contact plug over and electrically connected to the first source/drain region; and
a second contact plug over and aligned to the second source/drain region, wherein the second contact plug and the second source/drain region are spaced apart from each other by a portion of the first CESL to form a capacitor.

2. The device of claim 1 further comprising:
a second CESL over the top surface of the first ILD; and
a second ILD over the second CESL, wherein the first contact plug is in the first ILD and has a top surface substantially level with the top surface of the first ILD, and wherein and the second contact plug extends into the first ILD, the second CESL, and the second ILD.

3. The device of claim 2, wherein the second CESL is substantially planar, and wherein top edges of the first CESL and top surfaces of the gate electrode and the first ILD are in contact with a bottom surface of the second CESL.

4. The device of claim 2 further comprising a third contact plug in the second CESL and the second ILD, wherein the first contact plug and the third contact plug are in contact with other, and have a visible interface.

5. The device of claim 1 further comprising a source/drain silicide region on a surface of the first source/drain region, wherein the first contact plug is in physical contact with the source/drain silicide region, and wherein no silicide region is formed between and aligned to the second contact plug and the second source/drain region.

6. The device of claim 1, wherein the second contact plug comprises a bottom surface in physical contact with a top surface of the CESL.

7. The device of claim 1, wherein the second contact plug and the second source/drain region are further spaced apart from each other by a lower portion of the first ILD.

8. A device comprising:
a semiconductor material;
a gate dielectric over the semiconductor material;
a gate electrode over the gate dielectric;
a first source/drain region and a second source/drain region on opposite sides of the gate electrode;
a source/drain silicide region over the first source/drain region;
a first Contact Etch Stop Layer (CESL) over the first and the second source/drain region;
a first Inter-Layer Dielectric (ILD) over the first CESL, wherein top edges of the first CESL, a top surface of the gate electrode, and a top surface of the first ILD are substantially level with each other;
a second CESL over the first CESL, the gate electrode, and the first ILD;
a second ILD over the second CESL;
a first contact plug over and connected to the source/drain silicide region; and
a second contact plug disposed in the first ILD, wherein the second contact plug is over and aligned to the second source/drain region, and wherein the second contact plug and the second source/drain region are spaced apart from each other by a portion of the first CESL.

9. The device of claim 8, wherein the first contact plug has a top surface substantially level with the top surface of the first ILD, wherein the device further comprises a third contact plug over and contacting the first contact plug, and wherein the second and the third contact plugs are formed of a same material, and have top surfaces level with a top surface of the second ILD.

10. The device of claim 8, wherein the first and the second contact plugs both comprise metals.

11. The device of claim 8, wherein the first contact plug comprises a metal, and the second contact plug comprises polysilicon.

12. The device of claim 8, wherein edges of the source/drain silicide region are aligned to respective edges of the first contact plug.

13. The device of claim 8, wherein no silicide region is formed over and contacting the second source/drain region.

14. The device of claim 8 further comprising a gate contact plug penetrating through the second CESL to contact the gate electrode, wherein the gate contact plug and the second contact plug are formed of a same material.

15. A method comprising:
forming a gate dielectric at a surface of an active region comprising a semiconductor material;
forming a gate electrode over the gate dielectric;
forming a first source/drain region and a second source/drain region on opposite sides of the gate electrode;
forming a first Contact Etch Stop Layer (CESL) over the first and the second source/drain regions;
forming a first Inter-Layer Dielectric (ILD) over the first CESL, wherein top edges of the first CESL, a top surface of the gate electrode, and a top surface of the first ILD are substantially level with each other;
etching the first CESL and the first ILD to form a first opening, wherein the first source/drain region is exposed through the first opening;
forming a first contact plug in the first opening, wherein the first contact plug is electrically connected to the first source/drain region;
etching the first ILD to form a second opening over and aligned to the second source/drain region, wherein the etching of the first ILD to form the second opening stops before at least a lower portion of the first CESL is etched; and
forming a second contact plug in the second opening, wherein the second contact plug and the second source/drain region are spaced apart from each other by the lower portion of the first CESL.

16. The method of claim 15, wherein during the step of etching the first CESL and the first ILD to form the first opening, no portion of the first CESL and the first ILD over and aligned to the second source/drain region is etched.

17. The method of claim 15 further comprising:
forming a second CESL over the first CESL, the gate electrode, and the first ILD;
forming a second ILD over the second CESL; and
forming a third contact plug in the second CESL and the second ILD, wherein the third contact plug is over and in contact with the first contact plug, and wherein the second contact plug extends into the second CESL and the second ILD.

18. The method of claim 15 further comprising, after the first opening is formed, forming a source/drain silicide region at a surface of the first source/drain region and in the first opening, wherein the source/drain silicide region is in contact with the first source/drain region and the first contact plug.

19. The method of claim 15, wherein the step of etching the first ILD to form the second opening stops on the first CESL.

20. The method of claim 15, wherein the step of etching the first ILD to form the second opening stops before the first CESL is exposed and after an upper portion of the first ILD is etched.

* * * * *

UNITED STATES PATENT AND TRADEMARK OFFICE
CERTIFICATE OF CORRECTION

PATENT NO. : 8,659,090 B2
APPLICATION NO. : 13/335569
DATED : February 25, 2014
INVENTOR(S) : Chia-En Huang It is certified that error appears in the above-identified patent and that said Letters Patent is hereby corrected as shown below:

In the Claims

In Col. 6, line 13, claim 2, delete "and the second" and insert --the second--.

Signed and Sealed this
Thirteenth Day of May, 2014

Michelle K. Lee
*Deputy Director of the United States Patent and Trademark Office*